(12) United States Patent
Singh et al.

(10) Patent No.: US 9,372,245 B2
(45) Date of Patent: Jun. 21, 2016

(54) ENDOGENOUS MAGNETIZATION CONTRAST IN MRI

(71) Applicant: The Trustees of the University of Pennsylvani, Philadelphia, PA (US)

(72) Inventors: Anup Singh, Philadelphia, PA (US); Kejia Cai, Elkins Park, PA (US); Mohammad Haris, Philadelphia, PA (US); Hari Hariharan, Mount Laurel, NJ (US); Ravinder Reddy, Gladwyne, PA (US)

(73) Assignee: The Trustees Of The University Of Pennsylvania, Philadelphia, PA (US)

( * ) Notice: Subject to any disclaimer, the term of this patent is extended or adjusted under 35 U.S.C. 154(b) by 842 days.

(21) Appl. No.: 13/683,483

(22) Filed: Nov. 21, 2012

(65) Prior Publication Data
US 2013/0147477 A1     Jun. 13, 2013

Related U.S. Application Data

(60) Provisional application No. 61/562,293, filed on Nov. 21, 2011.

(51) Int. Cl.
*G01V 3/00* (2006.01)
*G01R 33/28* (2006.01)
(Continued)

(52) U.S. Cl.
CPC ............... *G01R 33/28* (2013.01); *G01R 33/20* (2013.01); *G01R 33/5605* (2013.01)

(58) Field of Classification Search
CPC ........................................................ G01R 33/28
USPC ............................................................ 324/309
See application file for complete search history.

(56) References Cited

U.S. PATENT DOCUMENTS

| 7,683,617 B2 * | 3/2010 | Van Zijl ............... | G01R 33/485 |
| | | | 324/307 |
| 2003/0160610 A1 * | 8/2003 | Van Zijl et al. .... | G01R 33/4804 |
| | | | 324/300 |

(Continued)

OTHER PUBLICATIONS

Balaban RS, Ceckler TL., "Magnetization transfer contrast in magnetic resonance imaging", Magn Reson Q 1992;8:116-137.

(Continued)

*Primary Examiner* — Rodney Fuller
(74) *Attorney, Agent, or Firm* — Baker & Hostetler, LLP

(57) ABSTRACT

An endogenous source of magnetic resonance image contrast of biological tissues is provided by modeling a conventional magnetization transfer (CMT) spectrum using z-spectral data and generating magnetization transfer ratio maps from the magnetization transfer spectrum at a frequency of interest. A contribution by the CMT spectrum from the z-spectral data is removed and a direct water saturation component is modeled using the z-spectral data with removed CMT spectrum (z-spectral). When this modeled direct water saturation component contribution is removed from the z-spectral, then the remaining z-spectra reflects new contrast due to chemical exchange saturation transfer (CEST) and magnetization transfer/exchange effect from aliphatic protons probably associated with labile proteins, peptides and lipids, named as novel magnetization transfer (NMT). This technique can be used to illustrate subtle changes in biological tissue as a result of diseases states, provide better visibility of brain white matter plaques, provide improved CEST contrast, provide better visualization of proteins, peptides, and lipids in biological tissue using NMT contrast, improve segmentation of white matter and gray matter in brain images, and the like.

17 Claims, 2 Drawing Sheets

(51) Int. Cl.
*G01R 33/20* (2006.01)
*G01R 33/56* (2006.01)

(56) References Cited

U.S. PATENT DOCUMENTS

| | | | | |
|---|---|---|---|---|
| 2010/0286502 | A1* | 11/2010 | Van Zijl et al. | G01R 33/483 600/410 |
| 2012/0271159 | A1* | 10/2012 | Song et al. | G01R 33/5601 600/420 |
| 2012/0286781 | A1* | 11/2012 | van Zijl et al. | G01R 33/5605 324/309 |
| 2012/0289818 | A1* | 11/2012 | van Zijl et al. | G01R 33/5601 600/414 |

OTHER PUBLICATIONS

Bryant RG., "The dynamics of water-protein interactions", Annu Rev Biophys Biomol Struct 1996;25:29-53.

Haris and Cai in "In vivo mapping of brain myo-inositol," Neuroimage, 2010, vol. 54, pp. 2079-2085.

Henkelman, Stanisz, and Graham, "Magnetization transfer in MRI: a review," NMR Biomed., 2001, vol. 14, pp. 57-64.

Hua and Jones in "Quantitative description of the asymmetry in magnetization transfer effects around the water resonance in the human brain," Magn. Reson. Med., 2007, 58(4), pp. 786-793.

Morrison and Henkelman, "A model for magnetization transfer in tissue," Magn. Reson. Med. 1996; vol. 35, p. 277.

OE Mougin, RC Coxon, et al., "Magnetization transfer phenomenon in the human brain at 7 T", NeuroImage 49 (2010) 272-281.

Pekar J, Jezzard P, et al., "Perfusion imaging with compensation for asymmetric magnetization transfer effects", Magn Reson Med 1996;35:70-79.

Peter CM van Zijl, et al., "Mechanism of Magnetization Transfer During On-Resonance Water Saturation. A New Approach to Detect Mobile Proteins, Peptides, and Lipids", Magn. Reson. Med. 2003; 49:440-449.

Sled JG, Pike GB., "Quantitative interpretation of magnetization transfer in spoiled gradient echo MRI sequences", J Magn Reson 2000;145:24-36.

Stanisz GJ, Odrobina EE, et al., "T1, T2 relaxation and magnetization transfer in tissue at 3T", Magn Reson Med 2005;54:507-512.

Swanson SD, Pang Y. "MT is symmetric but shifted with respect to water" In: Proceedings of the 11th Annual Meeting of ISMRM Toronto, Ontario, Canada, 2003 (Abstract 660).

Tozer D, Ramani A, Barker GJ, Davies GR, Miller DH, Tofts PS., "Quantitative magnetization transfer mapping of bound protons in multiple sclerosis," Magn Reson Med 2003;50:83-91.

Woessner and Zhang in "Numerical solution of the Bloch equations provides insights into the optimum design of PARACEST agents for MRI," Magn. Reson. Med., 2005; vol. 53, pp. 790-799.

Wolff SD, Balaban RS., "Magnetization transfer contrast (MTC) and tissue water proton relaxation in vivo", Magn Reson Med 1989;10: 135-144.

Zhou J, Payen J, et al., "Using the amide proton signals of intracellular proteins and peptides to detect pH effects in MRI", Nature Med 2003;9:1085-1090.

* cited by examiner

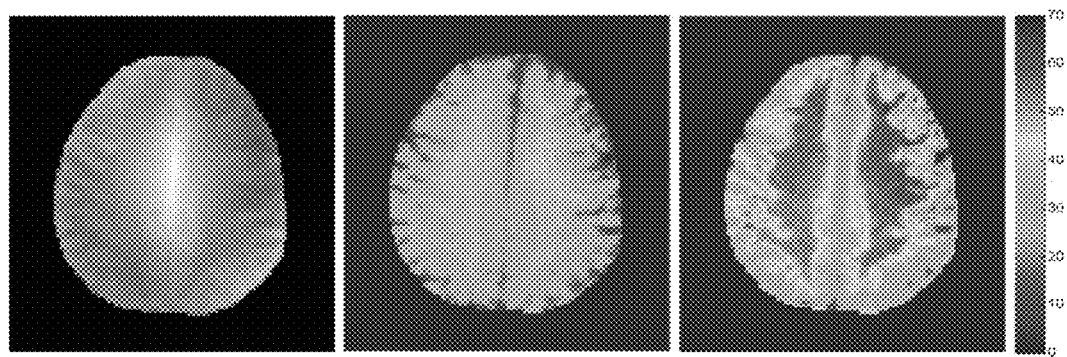
Anatomical Image  
Figure 5A
MTR, at 20ppm  
Figure 5B
MTR, at Center  
Figure 5C
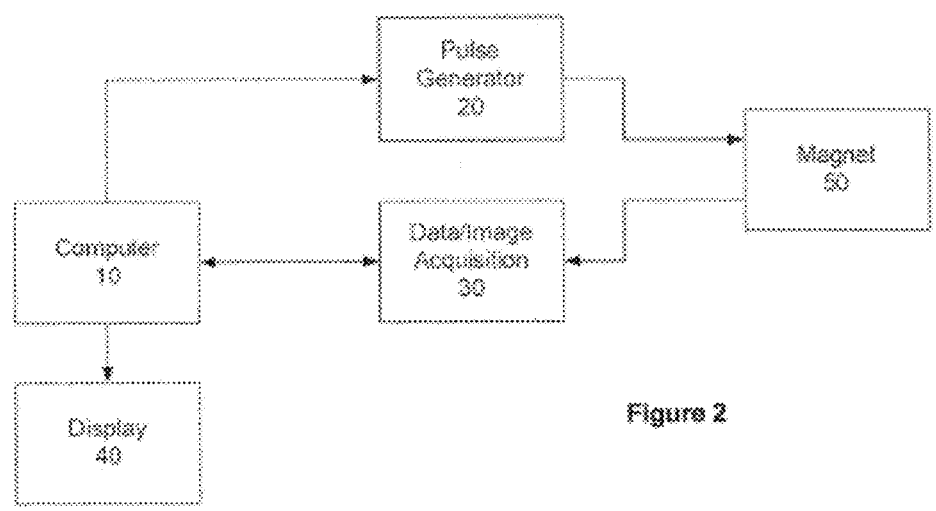
Figure 2

ENDOGENOUS MAGNETIZATION CONTRAST IN MRI

CROSS-REFERENCE TO RELATED APPLICATIONS

The present application claim priority to U.S. Provisional Patent Application No. 61/562,293, filed Nov. 21, 2011. The content of that application is herein incorporated by reference in its entirety.

STATEMENT OF FEDERALLY SPONSORED RESEARCH

The present invention was supported in part by the National Institutes of Health (NIH), through grant P41 EB015893. The government has certain rights in the invention.

TECHNICAL FIELD

The invention relates to a new pulse sequence and magnetic resonance imaging equipment and methods for imaging and computing the magnetization transfer and chemical exchange saturation transfer (CEST) contrast of dense soft tissues such as the brain or other parts of the nervous system using such a pulse sequence to detect minute changes in the soft tissues over time.

BACKGROUND

A typical magnetization transfer (MT) phenomenon in biological tissues is caused by the interaction between the solid-like, macromolecular bound water protons, such as those in protein matrices and cell membranes, and the free bulk water. In most disease conditions, such as Multiple Sclerosis (MS), tumor, stroke, and fibrosis, the concentration of a bound water pool associated with proteins and lipids (such as myelin in MS) changes. MT ratio (MTR) imaging, defined as the ratio of water magnetic resonance imaging (MRI) images with and without off-resonance radiofrequency (RF) irradiation at a single frequency, has been used as a contrast mechanism to probe white matter diseases in brain. Typically, the offset frequency chosen for MTR imaging is rather large (>20 ppm) to avoid direct water saturation (DS) effects.

In biological tissues, the conventional magnetization transfer (CMT) effect from macromolecules is asymmetric with respect to water resonance and this MT asymmetry also interferes with Chemical Exchange Saturation Transfer (CEST) effects from other brain metabolites and macromolecules with exchangeable —OH, —NH and —NH2 protons. CEST contrast is either reduced or in some cases completely suppressed by MT asymmetry ($MT_{asy}$) contamination.

Studies have been carried out to model the CMT effect along with DS using a two and three pool model. For example, see Morrison and Henkelman, "A model for magnetization transfer in tissue," Magn. Reson. Med. 1996; Vol. 35, p. 277, and Henkelman, Stanisz, and Graham, "Magnetization transfer in MRI: a review," NMR Biomed., 2001, Vol. 14, pp. 57-64. However, independent observation of the CMT spectrum has not been possible due to DS of the free water pool during z-spectra acquisition. Contamination of MT asymmetry to CEST has been reported by Hua and Jones in "Quantitative description of the asymmetry in magnetization transfer effects around the water resonance in the human brain," Magn. Reson. Med., 2007, Vo. 58(4), pp. 786-793. However, to the inventors' knowledge, no successful studies have been published for removing MT asymmetry contamination.

A clear dip in z-spectra data centered at approximately −3.5 ppm, with respect to water proton resonance, has been reported, particularly at high field and is characterized as a magnetization exchange/nuclear Over Hauser effect (NOE) from aliphatic protons associated with labile proteins, peptides and lipids. Hereafter this effect is named as novel magnetization transfer (NMT) effect. To the best of the inventors' knowledge, there is no study exploring the NMT effect as an in-vivo contrast, probably due to contaminations from DS and MT effects. The NMT effect may provide unique image contrast that is different from CMT or any traditional contrast observed in MRI, and may serve as a specific marker for pathological changes in various diseases. However, removal of the dominant DS and CMT asymmetry contribution from NMT effects is crucial before their application to explore in-vivo tissue environment and changes related to disease conditions.

SUMMARY

The invention addresses the aforementioned needs in the art by providing a new methodology for providing a new endogenous source of magnetic resonance (MR) image contrast of biological tissues. The method improves the CMT contrast associated with bound water by over 50% so as to enable the detection of subtle changes in pathological conditions including Multiple Sclerosis (MS) and Alzheimer's disease (AD). Using this technique, the sensitivity of CMT contrast is improved, the CEST and NMT contrast are computed separately at respective frequency of interest.

The technique of the invention uses a new pulse sequence and CMT and DS modeling from the experimental z-spectral data obtained with this sequence at a few frequency off-resonance saturations. The technique shows improved CMT contrast and determination of separate CEST and NMT components at respective frequencies with reduced MT and DS contamination.

In an exemplary embodiment, the method models a conventional magnetization transfer (CMT) spectrum using z-spectral data containing information about the CMT by acquiring z-spectral data at different offset frequencies and choosing frequency ranges ±(F2−F1) at which contributions from direct water saturation, CEST, and NMT contrast for magnetization transfer asymmetry are <1% to model the CMT effect contributions to the acquired z-spectral data. In the exemplary embodiment, the z-spectral data is acquired using a pulse sequence including a selective saturation pulse followed by a segmented RF spoiled gradient echo readout sequence and an optimized saturation pulse train having, for example, 10 Hanning windowed rectangular pulses of 100 ms duration each with a 200 µs delay between respective pulses.

In another embodiment, a method is provided for computing CEST contrast and/or NMT contrast in an acquired magnetic resonance image of biological tissues by performing the steps of:

acquiring z-spectral data of the biological tissues at different offset frequencies;

modeling conventional magnetization transfer (CMT) effect contributions to the acquired z-spectral data;

removing the modeled CMT effect contributions from the z-spectral data;

modeling a direct water saturation component using the z-spectral data without the modeled CMT effect contributions; and removing the modeled direct water saturation component contribution from the z-spectral data with removed CMT spectrum to leave CEST and NMT contrast components at respective frequencies of interest.

In these embodiments, the magnetization transfer ratio maps of the CMT spectrum may be used to detect changes in images of the biological tissues over time as a result of a disease state in the biological tissues, to highlight plaques in the white matter of a subject's brain, and to segment the white matter and gray matter of the subject's brain. Computed NMT component can be used to measure changes in labile macromolecules and the CEST component can be used to measure changes associated with CEST pools (having exchangeable —OH, —NH2 and —NH protons) in various disease conditions.

The invention also includes a magnetic resonance imaging device having a processor programmed by instructions from a computer readable storage medium to provide an endogenous source of magnetic resonance image contrast of biological tissues in accordance with the method of the invention. As will be appreciated by those skilled in the art, such magnetic resonance imaging devices include, in addition to the programmed processor, a magnet that applies a magnetic field to the biological sample to be imaged, a pulse generator responsive to a pulse sequence comprising, for example, a selective saturation pulse followed by a segmented RF spoiled gradient echo readout sequence and optionally an optimized saturation pulse train to acquire the z-spectral data from the biological sample, and an image processing device that displays the chemical exchange saturation transfer and magnetization transfer asymmetry contrast components.

BRIEF DESCRIPTION OF THE DRAWINGS

The various novel aspects of the invention will be apparent from the following detailed description of the invention taken in conjunction with the accompanying drawings, of which:

FIG. 2 is a block diagram of a magnetic resonance imaging system that may be programmed to generate pulse sequences in accordance with the invention.

FIGS. 5A-5C illustrate an anatomical image (FIG. 5A) and MTR maps (FIGS. 5B and 5C) from a healthy human brain using saturation pulse B1=200 Hz for 1 second on a 7T research MR scanner, where the MTR map at the center of the CMT spectrum (FIG. 5C) shows significantly improved sensitivity over the MTR map at 20 ppm (FIG. 5B).

DETAILED DESCRIPTION OF ILLUSTRATIVE EMBODIMENTS

The invention will be described in detail below with reference to FIGS. 1-5. Those skilled in the art will appreciate that the description given herein with respect to those figures is for exemplary purposes only and is not intended in any way to limit the scope of the invention. All questions regarding the scope of the invention may be resolved by referring to the appended claims.

Figure 1:
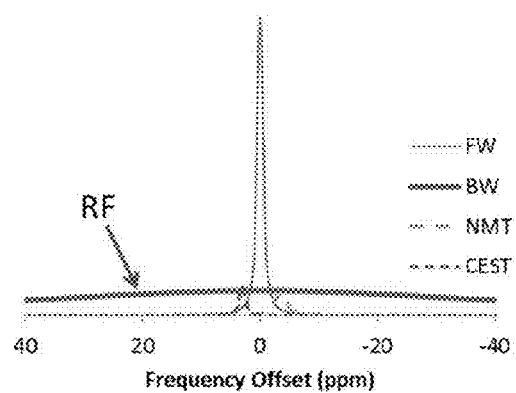
FIG. 1 illustrates separate spectrum components including free water (FW), bound water (BW), aliphatic protons probably associated with labile proteins, peptides and lipids (results in NMT effect), and the CEST pool, where the z-spectrum is a mixed response of direct saturation (DS) of FW, CMT of BW, CEST and NMT components.

FIG. 1 illustrates separate spectrum components including free water (FW), bound water (BW), aliphatic protons probably associated with labile proteins, peptides and lipids (results in NMT effect), and the CEST pool. The z-spectrum is a mixed response of DS of FW, CMT of BW, CEST and NMT components. Typically, for CMT contrast, an off-resonance RF pulse, avoiding direct saturation of water, is applied and the contrast is computed using the equation: $MTR=100*(1-S_{MT}/S_0)$, where $S_0$ and $S_{MT}$ are signal intensity without and with an MT pulse, respectively.

FIG. 2 is a block diagram of a magnetic resonance imaging (MRI) system that may be programmed to generate pulse sequences in accordance with the invention. As illustrated in block form, the main components of an MRI system are a computer 10, an RF pulse generator 20, a data processing element 30 including gradient coils (not shown), a display 40 and a magnet 50. A person skilled in the art will recognize that the different elements are well known in the art and thus require no explanation as to their construction. The computer 10 in the system of FIG. 2 in accordance with the invention is programmed, or can be programmed, to carry out the described RF pulse generating methods described herein.

Those skilled in the art will appreciate that the computer 10 of FIG. 2 may be implemented as any suitable computing environment including a processor programmed to execute software routines adapted to control the pulse generator 20 to generate radiofrequency (RF) pulses as described herein as well as to control data acquisition through control of the timing of data acquisition and the associated generation of imaging gradients by data processing device 30. Those skilled in the art will appreciate that the invention includes a machine or computer programmed by computer-executable instructions, such as program modules, so as to implement the methods described herein. The computer may be a client workstation, a server, a personal computer, or the like. Generally, the program modules include routines, programs, objects, components, data structures and the like that perform particular tasks or implement particular abstract data types. Moreover, it should be appreciated that the invention and/or portions thereof may be practiced with other computer system configurations, including hand-held devices, multi-processor systems, microprocessor-based or programmable consumer electronics, network PCs, minicomputers, mainframe computers and the like. The invention may also be practiced in distributed computing environments where tasks are performed by remote processing devices that are linked through a communications network. In a distributed computing environment, program modules may be located in both local and remote memory storage devices.

Those skilled in the art will further appreciate that the computer 10 may further include a device (not shown) for reading computer readable storage media such as a hard disk, a removable magnetic disk, and/or a removable optical disk such as a CD-ROM or other optical media. Such devices (e.g., hard disk drive) and their associated computer-readable storage media provide non-volatile storage of computer readable instructions, data structures, program modules and other data for the computer. It will be further appreciated by those skilled in the art that other types of computer readable media that can store data that is accessible by a computer may also be used to store software code for implementing the methods of the invention in the exemplary operating environment. Such other types of media include a magnetic cassette, a flash memory card, a digital video disk, a Bernoulli cartridge, a random access memory (RAM), a read-only memory (ROM), and the like. The invention includes such computer readable storage media having instruction stored thereon that, when executed by a processor, cause the processor to implement the techniques of the invention as described below.

Pulse Sequence:

The z-spectra data were acquired on a Siemens whole-body clinical 3.0 T and research 7.0 T MR scanner (Siemens medical systems, Malvern, Pa.). The pulse sequence used in current study consists of a frequency selective saturation pulse train (user selected saturation offset frequency ($\Delta\omega$), saturation duration and saturation power) followed by a segmented RF spoiled gradient echo (GRE) readout acquisition with centric phase encoding order. At the end of the GRE acquisition segments, a variable delay has been added to provide T1 recovery and keep the sequence under system RF safety limits. An optimized saturation pulse train with variable number of Hanning windowed rectangular pulses with duty cycle constraint by hardware limits was used. The total repetition time of the sequence was adjusted to stay within RF specific absorption rate (SAR) limits. The sequence parameters were: GRE flip angle=10°, GRE readout TR=5.6 ms, and TE=2.7 ms. The z-spectra images were collected at frequencies [−8, 8] ppm with step of 0.25 ppm, at [±10, ±20] ppm with step size of 1 ppm, at [±25, ±50] ppm with step size of 5 ppm, and at [±60, ±100] ppm at step size of 10 ppm. The z-spectra were collected at different saturation pulse amplitudes (a peak B1 of 50 Hz, 100 Hz, 200 Hz) and durations (1s, 2s). $B_0$ and $B_1$ map data was also obtained and maps were computed using the procedure described by Haris and Cai in "In vivo mapping of brain myo-inositol," Neuroimage, 2010, Vol. 54, pp. 2079-2085, the content of which is hereby incorporated by reference in its entirety.

MT Modeling:

The acquired z-spectra curve contains information about CMT, DS, CEST and NMT effects. Except for the CMT effect, the remaining contributes only over a small range of frequency offsets due to their narrow line shapes. The basic strategy of the current procedure is to choose frequency ranges ±(F2−F1) at which contributions from DS and other effects are <1% and the CMT effect is >1% to model MT effect contributions to z-spectra using Lorentzian lineshape. The fitted Lorentzian function is used for estimating the entire MT data. For example, the inventors used F1=20 ppm and F2=60 ppm for phantom and brain data obtained using a saturation pulse train with Hanning windowed rectangular pulses lasting for 1 second with a peak B1 of 250 Hz. The choice of F1 and F2 depends upon the tissue under consideration, saturation pulse parameters, etc. and an estimate can be obtained using simulations. The accuracy of fitting is then tested in various situations.

CEST and NMT Contrast Computation:

After removing the modeled CMT component, the z-spectra contains DS, CEST and NMT components. The DS effect is symmetric with respect to the central frequency, while the other two components are on the left and right side of water resonance. In the conventional way of CEST computation, the DS contamination is subtracted out; however, the obtained contrast is a mixed response of CEST and NMT effects. The conventional way of CEST computation provides an accurate contrast only if there is negligible contribution of the NMT effect. Here, the inventors attempted to model a pure DS component by the Lorentzian function using partial z-spectral data without a CMT component and with minimal contribution of CEST and NMT effects. The CEST and NMT contrast at the frequency of interest was computed by subtracting z-spectra (without CMT) from the modeled DS component.

Method Steps

The method of for providing a new endogenous source of magnetic resonance (MR) image contrast of biological tissues in accordance with the invention includes the steps of:

Step 1: Model the CMT spectrum using [20, 60] ppm z-spectral data for generating MTR maps at the frequency of interest and remove the CMT contribution from the z-spectrum.

Step 2: Model the DS component using the CMT corrected z-spectrum data with minimal CEST/NMT contribution. For example, use ±[0, 0.75] ppm and ±[16, 20] ppm data.

Step 3: Remove the modeled DS contribution from the CMT corrected z-spectra, leaving only CEST/NMT components.

Simulations

Numerical simulations of Bloch-McConnell equations (e.g., as described by Woessner and Zhang in "Numerical solution of the Bloch equations provides insights into the optimum design of PARACEST agents for MRI," Magn. Reson. Med., 2005; Vol. 53, pp. 790-799) with two pool (free & bound water leading to CMT effect) and three pool (free water, bound water and exchangeable protons leading to CEST effect (3.5 ppm)) are used to model the z-spectra with physiological parameters. The simulations were carried out with the same saturation pulse parameters as used in the phantom and in-vivo experiments. The bound water pool central frequency was manually shifted by −2.4 ppm for generating data for testing accuracy of the current method. The parameters used in the simulations were: T1w=1.7 s, T2w=0.06 s, Free water=74 M, T1b=1 s, T2b=30 μs, Bound water=14 M, and a CEST component (100 mM) exhibiting CEST at 3.5 ppm and an exchange rate=30 Hz. These simulation parameters were varied in order to consider different situations. The model worked well in all the situations under consideration.

Figure 3A:
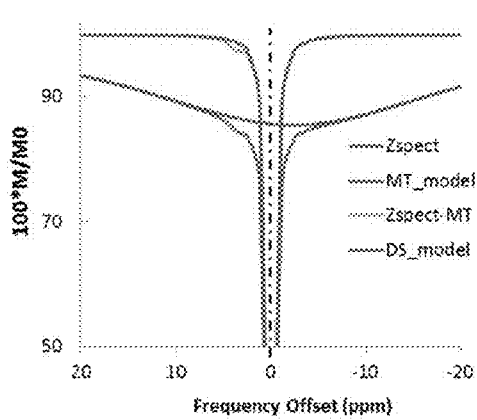
FIGS. 3A and 3B illustrate the z-spectra (left side) mimicking human brain data (WM) using simulations, modeled CMT and z-spectra without CMT and modeled DS curve, where saturation B1=50 Hz for 3 seconds, and the CEST contrast (right side) computed using a conventional method (FIG. 3A) and the proposed method (FIG. 3B) from the z-spectra of WM tissue.
Figure 3B:
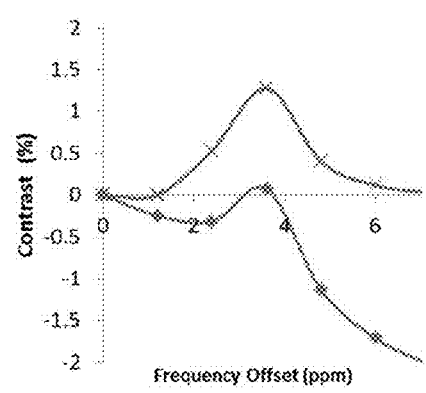

FIG. 3 illustrates the z-spectra (left side) mimicking human brain data (WM) using simulations, modeled CMT and z-spectra without CMT and modeled DS curve, where saturation B1=50 Hz for 3 seconds, and the CEST contrast (right side) computed using a conventional (FIG. 3A) and the proposed method (FIG. 3B) from the z-spectra of WM tissue.

In-Vivo Data

Figure 4A:
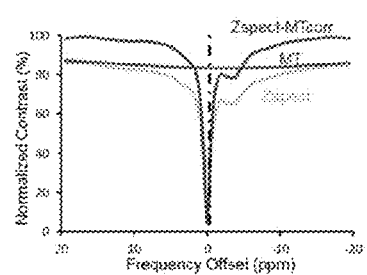
FIGS. 4A-4C illustrate an original z-spectra, modeled CMT, and z-spectra without CMT from human brain tissue acquired with saturation B1=50 Hz for 1 second on a 7T research scanner (FIG. 4A), removal of a DS component from the z-spectrum without MT to provide CEST and NMT components (FIG. 4B), and an MT asymmetry (MTasy) curve obtained using the relation: MTasy=abs(MT(−f)−MT(+f)]/MT(−f) (FIG. 4C).
Figure 4B:
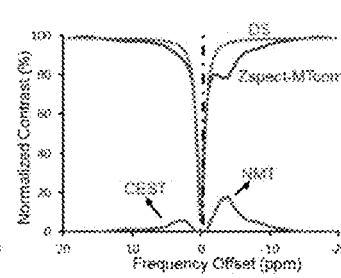
Figure 4C:
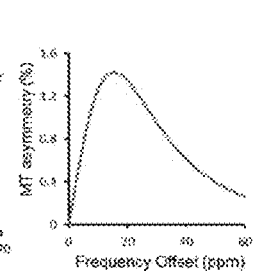

A study was conducted under an approved Institutional Review Board protocol of the University of Pennsylvania. With informed consent, in-vivo data from three healthy volunteers was acquired at 7 T and 3 T whole body clinical scanners. For demonstration of the method in an in-vivo situation, a brain z-spectrum with $B_1$=50 Hz, 100 Hz, and 200 Hz and duration of 1 second were used. In FIG. 4, results are shown from human brain data (WM) acquired using a saturation pulse of B1=50 Hz and duration of 1 second at 7 T. The computed NMT and CEST components after CMT and DS removal from the z-spectra using the technique of the invention are shown in FIG. 4B. MT asymmetry (FIG. 4C) contribution (calculated as MTasy=abs(MT(−f)−MT(+f)/MT(−f)) is small close to the water frequency. The technique provided satisfactory results for different pulse parameters and on both sets of scanner (7T & 3T) data.

FIG. 5 shows a conventional MTR map (FIG. 5A) and a generated MTR map at the CMT center (FIG. 5C) using the method of the invention. The MTR map at the CMT center shows much higher sensitivity compared to the conventional MTR map (FIG. 5B). It will thus be appreciated that the modeled CMT can be used to explore maximum MTR contrast. Due to increased sensitivity, this approach may find great applications in exploring even small macromolecules changes during disease conditions.

The method of the invention was also validated using in-vitro BSA phantoms (with and without cross linking), and dependence on pH, temperature, concentration and saturation parameters were also characterized.

Commercial Uses and Applications

A complete CMT spectrum can be modeled using the technique of the invention. The sensitivity of the MTR contrast at the center of MTasy is much higher compared to typically computed MTR at far off-resonances like 20 ppm. Due to improved sensitivity of MTR contrast, it becomes possible to detect early changes in a macromolecular environment in various diseases including MS, Alzheimer's disease, stroke, tumor, etc. Moreover, CMT asymmetry can provide more insight into the tissue environment and may be used to provide better visibility of brain white matter plaques caused by MS, for example, or to improve segmentation of white matter and gray matter in brain images.

A major application of the technique of the invention is in correction of CEST contrast. The CEST contrast sensitivity can be improved significantly which may provide a better way to explore metabolites environments in normal and pathological conditions.

The observed NMT effect after CMT and DS removal also can be used in exploring labile proteins, peptides, and lipids content in-vivo. This phenomenon shows significant contrast over a range of approximately 1-8 ppm and could serve as a novel biomarker for disease conditions including MS, AD, brain tumors and other neurodegenerative diseases.

With improved sensitivity, these techniques can be easily incorporated into the routine clinical scan to diagnose various diseases in early stages as well as to monitor the therapeutic efficacy. These quantitative MRI techniques also may be used for testing the treatment responses of drugs.

Those skilled in the art will appreciate that the method of the invention can generate pure CMT z-spectra from a few experimental measurements. Previously reported models are highly non-linear, and are difficult to implement in routine clinical MR and research studies. However, the method of the invention uses simple fitting of partial z-spectrum experimental data that is reliable and can be easily incorporated into clinical and research MRI studies. CEST contrast computation also becomes more reliable and the specificity of CEST contrast computation can be improved substantially. High resolution MRI of the NMT effect is demonstrated for the first time and it can provide new image contrast from biological tissues.

Those skilled in the art will also appreciate that the invention may be applied to other applications and may be modified without departing from the scope of the invention. For example, the radiofrequency pulses described herein are those used for a nuclear magnetic resonance spectroscopy or imaging experiments. The sequence may be used as an imaging technique for diagnosis of many diseases including, for example, Alzheimer's disease, osteoarthritis, multiple sclerosis, atherosclerosis, and cancer. The pulse sequence may also be used as an imaging tool for viewing the biomechanics and/or biochemistry of tissues and the progression of disease, tissue repair, or the effects of pharmaceutical agents on the tissues. Generally, the radiofrequency pulses described herein may have any frequency and may be used for other applications such as electron paramagnetic resonance. Accordingly, the scope of the invention is not intended to be limited to the exemplary embodiments described above, but only by the appended claims.

What is claimed:

1. A method of determining a novel magnetization transfer (NMT) effect associated with aliphatic protons of labile macro molecules and chemical exchange saturation transfer (CEST) contrast in an acquired magnetic resonance image of biological tissues, comprising the steps of:
   acquiring z-spectral data of the biological tissues at different offset frequencies of the acquired magnetic resonance image of the biological tissues;
   modeling conventional magnetization transfer (CMT) effect contributions to the acquired z-spectral data;
   removing the modeled CMT effect contributions from the z-spectral data;
   modeling a direct water saturation component using the z-spectral data without the modeled CMT effect contributions;
   removing the modeled direct water saturation component contribution from the z-spectral data with removed CMT spectrum to leave CEST and NMT contrast components at respective frequencies of interest; and
   providing the CEST and NMT contrast components at the respective frequencies of interest on the acquired magnetic resonance image of the biological tissues.

2. The method of claim 1, wherein the z-spectral data is acquired using a pulse sequence comprising a selective saturation pulse followed by a segmented RF spoiled gradient echo readout sequence.

3. The method of claim 2, wherein the pulse sequence further comprises an optimized saturation pulse train comprising a variable number of Hanning windowed rectangular pulses with duty cycle constraint by hardware limits.

4. The method of claim 1, further comprising using the magnetization transfer ratio maps of the CMT spectrum to detect changes in images of the biological tissues over time as a result of a disease state in the biological tissues.

5. The method of claim 1, wherein said biological tissues comprise white matter and gray matter of a subject's brain and the contrast components highlight plaques in the white matter.

6. The method of claim 1, wherein said biological tissues comprise white matter and gray matter of a subject's brain and the contrast components segment the white matter and gray matter.

7. The method of claim 1, wherein said biological tissues comprise labile macromolecules of a subject and the contrast components near free water resonance highlight the labile macromolecules in a magnetic resonance image of said biological tissues.

8. A device for creating a magnetic resonance image of a biological sample, comprising:
   a magnet that applies a magnetic field to the biological sample to be imaged;
   a processor programmed to provide an endogenous source of magnetic resonance image contrast of biological tissues by performing the steps of:
   modeling a conventional magnetization transfer (CMT) spectrum using z-spectral data and generating magnetization transfer ratio maps from the magnetization transfer spectrum at a frequency of interest,
   removing a contribution by the CMT spectrum from the z-spectral data, modeling a direct water saturation component using the z-spectral data with removed CMT spectrum, and removing the modeled direct water saturation component contribution from the z-spectral data with removed CMT spectrum to leave CEST and NMT contrast components at respective frequencies of interest;

a pulse generator responsive to a pulse sequence comprising a selective saturation pulse followed by a segmented RF spoiled gradient echo readout sequence; and an image processing device that displays said chemical exchange saturation transfer and magnetization transfer asymmetry contrast components.

9. The device of claim 8, wherein the pulse sequence further comprises an optimized saturation pulse train comprising a variable number of Hanning windowed rectangular pulses with duty cycle constraint by hardware limits.

10. The device of claim 8, wherein the processor is further programmed to use the magnetization transfer ratio maps of the CMT spectrum to detect changes in images of the biological sample over time as a result of a disease state in the biological sample.

11. The device of claim 8, wherein said biological sample comprises white matter and gray matter of a subject's brain and the contrast components highlight plaques in the white matter.

12. The device of claim 8, wherein said biological sample comprises white matter and gray matter of a subject's brain and the contrast components segment the white matter and gray matter.

13. The device of claim 8, wherein said biological sample comprises labile macromolecules of a subject and the contrast components near free water resonance highlight the labile macromolecules in the magnetic resonance image of said biological sample.

14. The device of claim 13, wherein the NMT contrast components are associated with the labile macromolecules and the chemical exchange saturation transfer (CEST) contrast components are associated with molecules/macromolecules having exchangeable protons (—OH, —NH2, —NH) at the respective frequencies of interest.

15. A nonvolatile computer readable storage medium storing instructions that when executed by a processor cause said processor to implement a method of determining a novel magnetization transfer (NMT) effect associated with aliphatic protons of labile macromolecules and chemical exchange saturation transfer (CEST) contrast in an acquired magnetic resonance image of biological tissues, said instructions, when processed, implementing the steps of:

acquiring z-spectral data of the biological tissues at different offset frequencies of the acquired magnetic resonance image of the biological tissues;

modeling conventional magnetization transfer (CMT) effect contributions to the acquired z-spectral data;

removing the modeled CMT effect contributions from the z-spectral data;

modeling a direct water saturation component using the z-spectral data without the modeled CMT effect contributions;

removing the modeled direct water saturation component contribution from the z-spectral data with removed CMT spectrum to leave CEST and NMT contrast components at respective frequencies of interest; and providing the CEST and NMT contrast components at the respective frequencies of interest on the acquired magnetic resonance image of the biological tissues.

16. The medium of claim 15, further comprising instructions that cause said processor to use the magnetization transfer ratio maps of the CMT spectrum to detect changes in images of the biological tissues over time as a result of a disease state in the biological tissues.

17. The medium of claim 15, wherein the z-spectral data is acquired using a pulse sequence comprising a selective saturation pulse followed by a segmented RF spoiled gradient echo readout sequence and an optimized saturation pulse train comprising a variable number of Hanning windowed rectangular pulses with duty cycle constraint by hardware limits.

* * * * *